United States Patent [19]

Nagatomo

[11] Patent Number: 5,194,404
[45] Date of Patent: Mar. 16, 1993

[54] METHOD OF MANUFACTURING A CONTACT STRUCTURE FOR A SEMICONDUCTOR DEVICE

[75] Inventor: Yoshiki Nagatomo, Tokyo, Japan

[73] Assignee: Oki Electric Industry Co. Ltd., Tokyo, Japan

[21] Appl. No.: 671,525

[22] Filed: Mar. 19, 1991

[30] Foreign Application Priority Data

Mar. 22, 1990 [JP] Japan ................................. 2-69679

[51] Int. Cl.⁵ .......................................... H01L 29/46
[52] U.S. Cl. ................................. 437/192; 437/193; 437/200; 437/46
[58] Field of Search .................. 437/192, 193, 200, 46

[56] References Cited

U.S. PATENT DOCUMENTS

| | | | |
|---|---|---|---|
| 4,801,559 | 1/1989 | Imaoka | 437/193 |
| 4,816,425 | 3/1989 | McPherson | 432/192 |
| 4,897,368 | 1/1990 | Kobushi et al. | 437/193 |
| 4,906,591 | 3/1990 | Okumura | 437/193 |
| 5,094,981 | 3/1992 | Chung et al. | 427/200 |

FOREIGN PATENT DOCUMENTS 60-253221 12/1985 Japan .

OTHER PUBLICATIONS

Murarka et al. "Refractory Silicides of Titanium and Tantalum for Low-Resistivity Gates and Innerconnects" IEEE Journal of Solid-State Circuits vol. SC-15, No. 4, Aug. 1980 pp. 474–481.

Yoshitaka Narita et al, "A New CMOS SCRAM Cell with Fully Planarizing Technology", *Symposium on VLSI Technology*, 1987, pp. 103–104.

Primary Examiner—John S. Maples
Attorney, Agent, or Firm—Spencer, Frank & Schneider

[57] ABSTRACT

A method of manufacturing a low resistance contact structure for a semiconductor device wherein a polycide layer is formed on a semiconductor substrate, and the surface of the substrate is covered with an interlayer isolation layer which is provided with a contact hole over the polycide layer. After filling the contact hole with polycrystalline silicon or forming a polycrystalline silicon contact or a polycide structure contact which connects to the polycide layer at the contact hole, the structure is subjected to a short term and high temperature annealing treatment at a temperature over 900° C.

17 Claims, 11 Drawing Sheets

METHOD OF MANUFACTURING A CONTACT STRUCTURE FOR A SEMICONDUCTOR DEVICE

CROSS REFERENCE TO RELATED APPLICATIONS

This application claims the priority of Japanese Application Ser. No. 2-69,679, filed Mar. 22, 1990, the subject matter of which is incorporated herein by reference.

BACKGROUND OF THE INVENTION

This invention relates to a method of manufacturing a semiconductor device, and more particularly, to a method of manufacturing a contact structure including a polycrystalline silicon (hereafter poly-Si) layer and a silicide layer.

A prior method of manufacturing a semiconductor device is described in "A New CMOS SRAM Cell with Fully Planarizing Technology", 1987 Symposium on VLSI Technology, Digest of Technical Papers pp. 103–104. This prior method includes a substantial number of steps including two steps of making contact holes, four steps of growing poly-Si in the contact holes, and two steps of etching back poly-Si layers. Moreover, in this method, when poly-Si is grown on a silicide layer, a thin oxide layer is formed incidentally between the poly-Si and the silicide layer. Therefore, an increased contact resistance between the poly-Si layer and the silicide layer is caused by the thin oxide layer.

SUMMARY OF THE INVENTION

It is an object of the present invention to provide a method of manufacturing a contact structure for a semiconductor device in which a silicide layer and a poly-Si layer can be directly contacted. It is still another object of the present invention to provide a method of manufacturing a contact structure for a semiconductor device having a low contact resistance between a silicide layer and a poly-Si contact layer. It is another object of the present invention to provide a method of manufacturing a contact structure for a semiconductor device having an ohmic contact between the silicide layer and the poly-Si contact layer.

The above objects are generally achieved according to the present invention by a method of manufacturing a contact structure for a semiconductor device which comprises the steps of: providing a semiconductor substrate; forming a silicide layer on a surface of the semiconductor substrate; forming a polycrystalline silicon layer on the silicide layer; introducing an impurity into the polycrystalline silicon layer; and subjecting the structure obtained by the above steps to an annealing heat treatment at a temperature above about 900° C.

As a result of the high temperature heat treatment, any oxide layer incidentally formed between the silicide and polycrystalline silicon layers during the formation of the latter layer is at least partially destroyed, resulting in a low resistance ohmic contact.

According to further general features of the invention, the silicide layer is WSi, the temperature is between 900° and 1150° C., and the impurity is introduced by ion implantation.

According to the preferred embodiment of the invention, the silicide layer is formed on at least a portion of the surface of an isolation oxide layer formed on the substrate surface, an insulating layer is on the silicide layer and is provided with at least one contact hole which exposes a part of the silicide layer, and the polycrystalline silicon is deposited onto the exposed silicide layer within the contact hole or holes.

BRIEF DESCRIPTION OF THE DRAWINGS

These and other features and advantages of the invention will be further understood from the following detailed description of the preferred embodiments with reference to the accompanying drawings in which.

DETAILED DESCRIPTION OF THE PREFERRED EMBODIMENTS

Figure 1A:
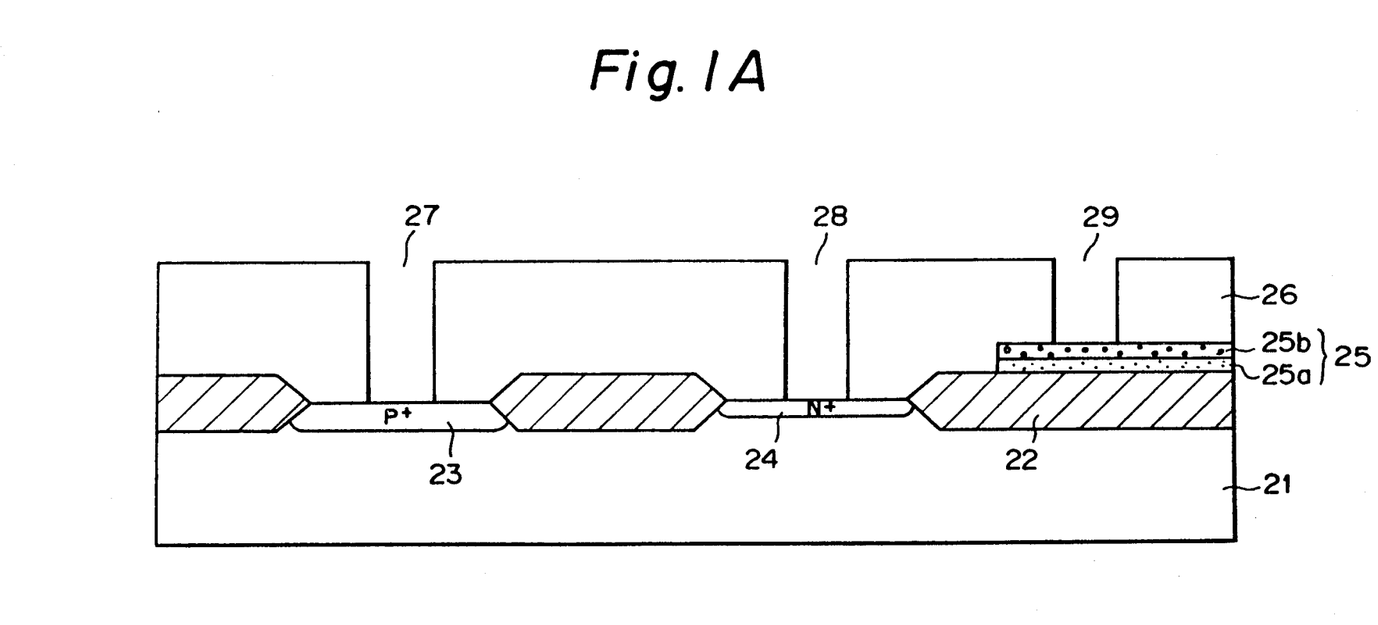
FIGS. 1A to 1F are sectional views showing various steps in a method of manufacturing a wiring structure of a semiconductor device according to a first embodiment of the invention.

A first embodiment of the invention will be described with reference to the drawings. FIGS. 1A to 1F illustrate the fabrication steps for a first embodiment. Initially, an isolation oxide layer 22 having openings at desired locations is formed on a silicon substrate 21 by the local oxdization of silicon (LOCOS) method. A P+ diffusion region 23 and an N+ diffusion region 24 are formed in respective portions of the surface of the silicon substrate not covered by the isolation layer 22, within the openings. A polycide layer 25, which includes a doped poly-Si layer 25a as a lower layer and a silicide layer 25b, preferably tungsten silicide (hereafter WSi), as an upper layer, is formed on the isolation oxide layer 22. An insulating layer 26 is formed on the isolation layer 22, the diffusion regions 23 and 24 and the polycide layer 25. Then, portions of the insulating layer 26 are selectively removed photolithographically to form contact holes 27, 28 and 29 which have a small diameter, e.g., 1 μm, and which are located on the P+ diffusion region 23, the N+ diffusion region 24 and the polycide layer 25, respectively, as shown in FIG. 1A.

Figure 1B:
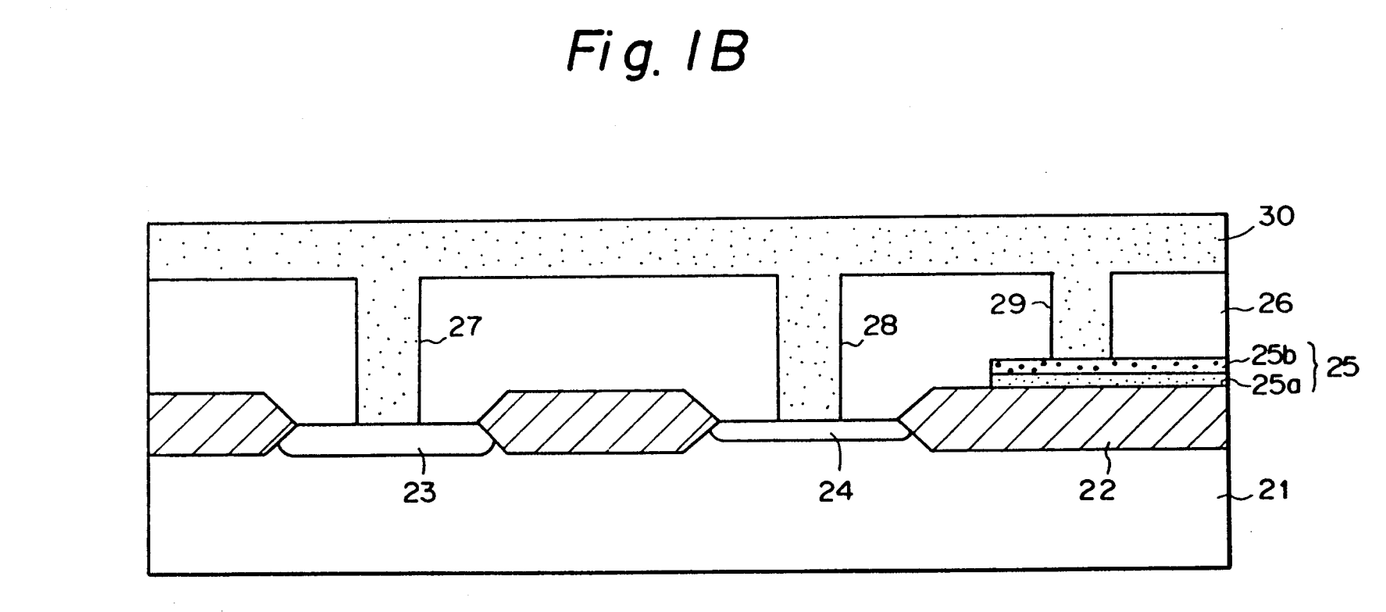

As shown in FIG. 1B, and by means of a low pressure chemical vapor deposition (LPCVD), a layer 30 of non-doped poly-Si (non-doped poly-Si layer) is formed on the entire surface of the structure shown in FIG. 1A. When the non-doped poly-Si layer 30 is formed, a thin oxide layer 36 (not shown in FIG. 1B but shown in FIG. 2A) is formed, incidentally, on a portion of the surface of the WSi layer 25b on which the non-doped poly-Si layer 30 is formed. The LPCVD method is performed by pyrolysis of monosilane (SiH$_4$) gas at a pressure of 0.1–0.5 Torr and a temperature of 570°–650° C. The non-doped poly-Si layer 30 is formed to a thickness substantially the same as the diameter of the contact holes 27, 28 and 29, e.g., 1 82 m. Therefore, the contact holes 27, 28 and 29 are completely filled with poly-Si and the surface of the non-doped poly-Si layer 30 is flattened as shown in FIG. 1B.

Figure 1C:
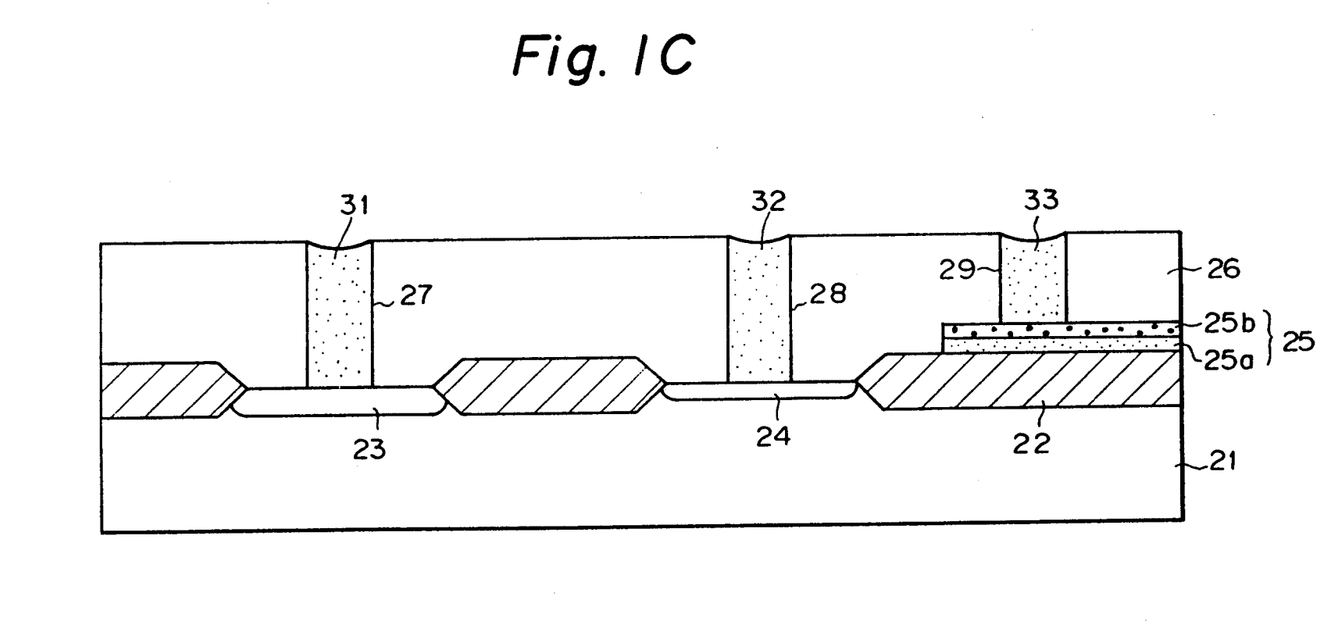

Referring to FIG. 1C, the non-doped poly-Si 30 layer is etched back by a dry or wet etching method to the insulating layer 26 so that non-doped poly-Si remains only in the contact holes 27, 28 and 29. The remaining portions of the non-doped poly-Si layer 30 located in the contact holes 27, 28 and 29 are denoted buried poly-Si portions 31, 32 and 33, respectively.

Figure 1D:
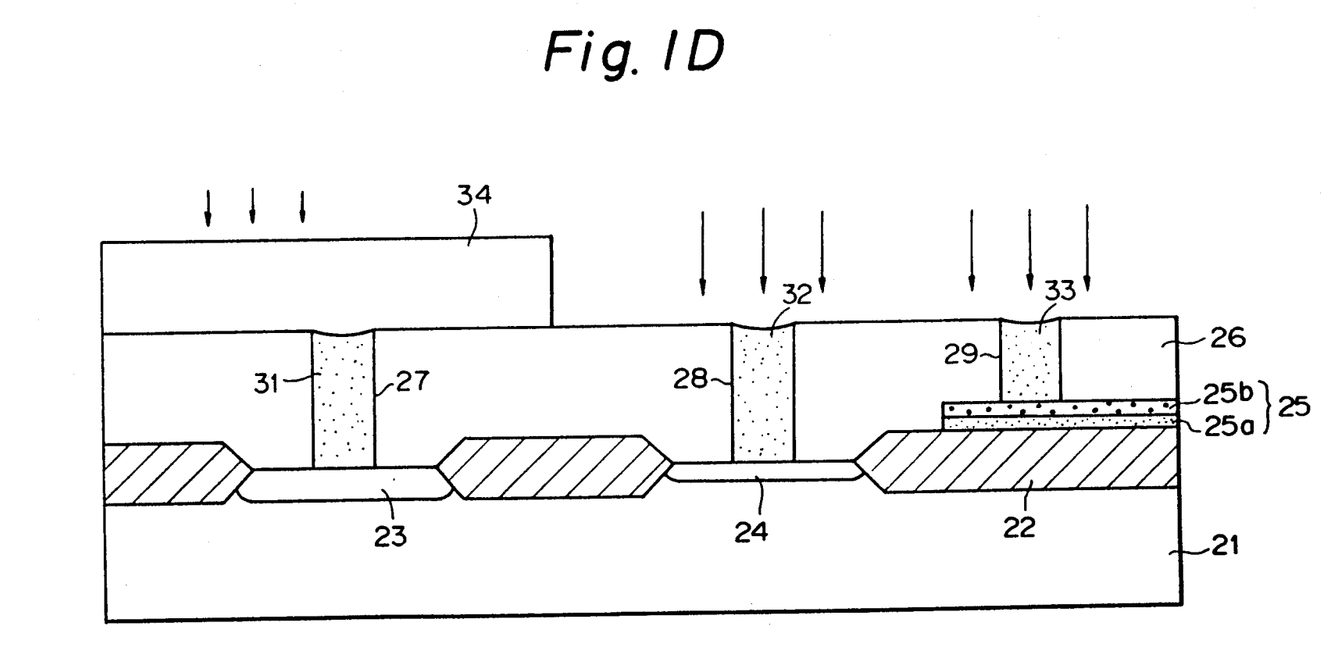

Next, as shown in FIG. 1D, a first patterned resist layer 34 is formed on a part of the insulating layer 26 to cover the buried poly-Si portion 31 and expose the buried poly-Si portions 32 and 33. Then, an N type impurity, for example, phosphorus ions or arsenic ions, is introduced into the buried poly-Si portions 32 and 33 by ion implantation at a dosage of about $5 \times 10^{15}$ to $2 \times 10^{16}$ cm$^{-2}$. The energy of the ion implantation is about 30-200 KeV.

Figure 1E:
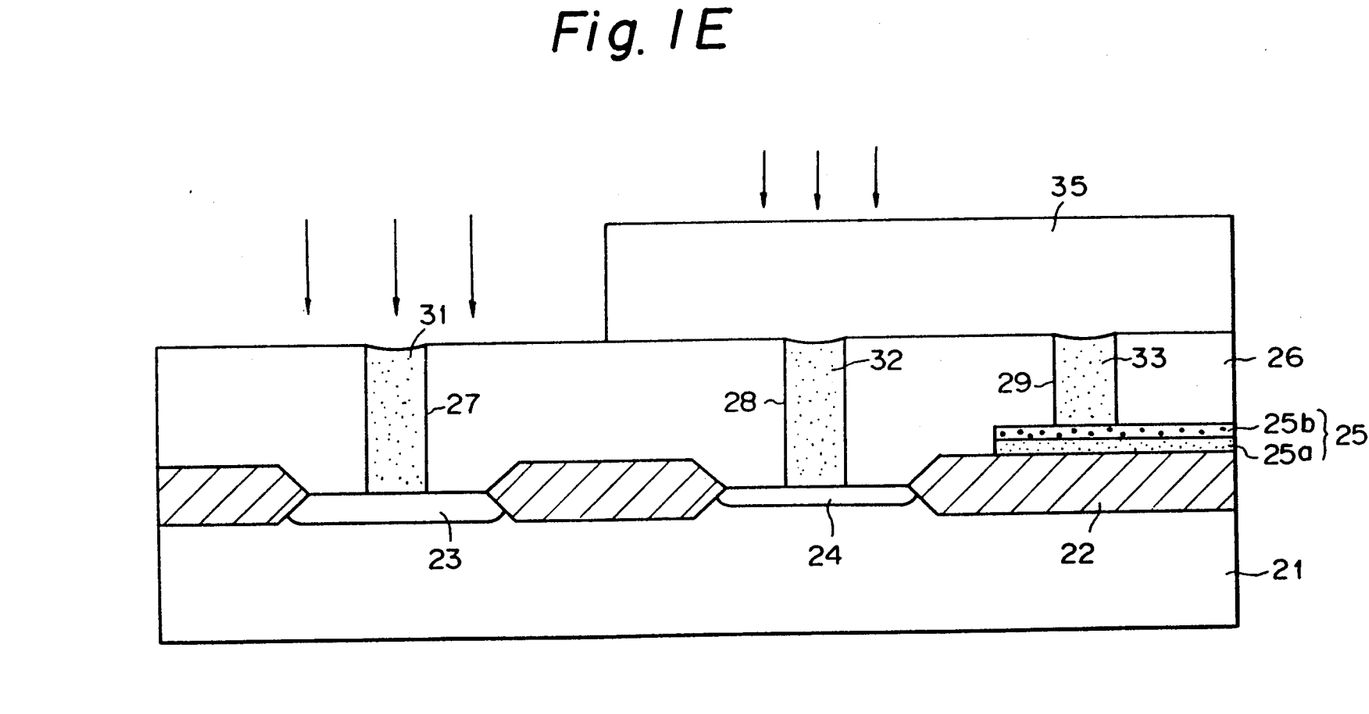

Thereafter, the resist layer 34 is removed and a second patterned resist layer 35 is formed on a part of the insulating layer 26 to cover the buried poly-Si portions 32 and 33 and expose the portion 31 as shown in FIG. 1E. After that, a P type impurity, for example boron ions or boron fluoride (BF$_2$) ions, is introduced into the buried poly-Si portion 31 by ion implantation at a dosage of $5 \times 10^{15}$ to $2 \times 10^{16}$ cm$^{-2}$. The energy of the ion implantation is about 30 KeV. Then, the resist layer 35 is removed.

In order to activate the introduced impurity, the entire structure shown in FIG. 1E is subjected to a heat treatment. The heat treatment is conducted at a temperature of about 900-1150° C. in ten seconds and preferably with a rapid increasing rate of temperature of the heat treatment, for example, at least 100° C./1 min. and with a rapid subsequent decreasing rate of temperature of the heat treatment, for example, at least 100° C./1 min. Simultaneously, the heat treatment causes viscous flow of the oxide of the thin oxide layer 36 formed on the WSi layer 25b to occur (as will be explained below), thereby causing the thin oxide layer 36 to be destroyed and the WSi layer 25b to be contacted directly by the buried poly-Si portion 33.

Figure 1F:
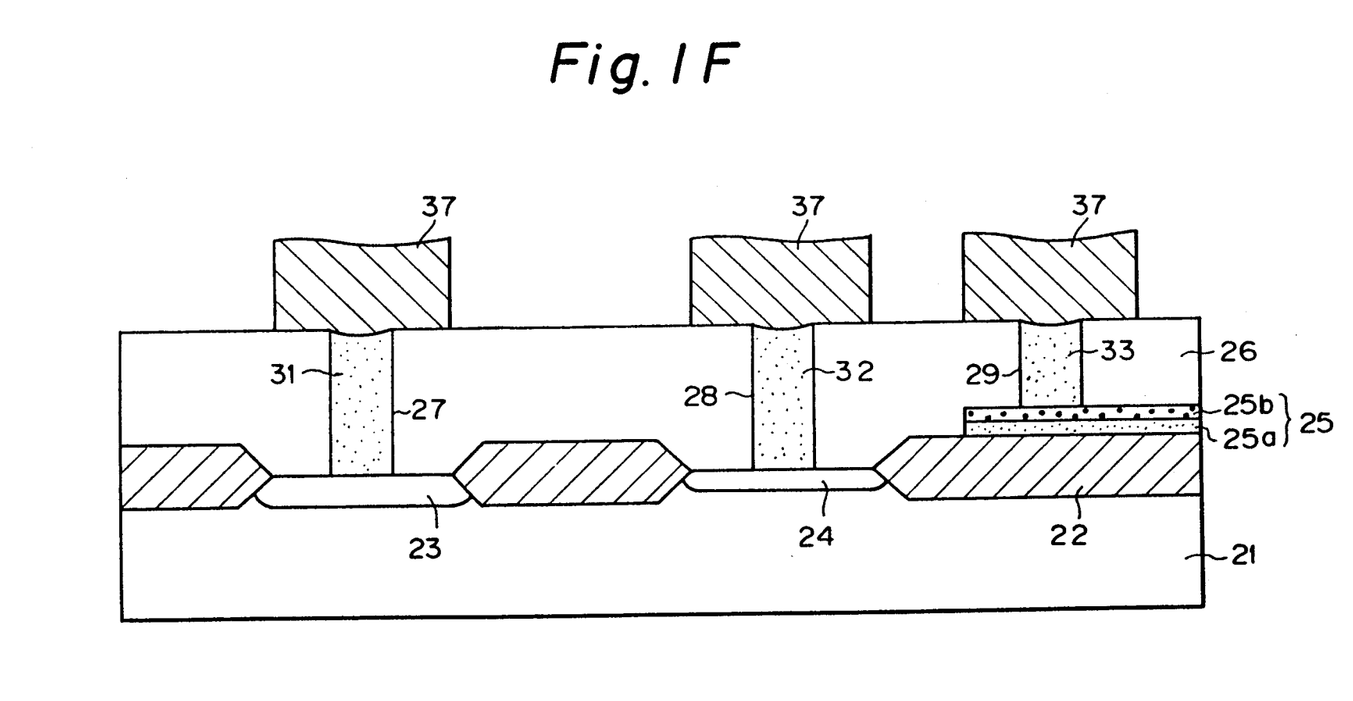

Finally, referring to FIG. 1F, aluminum contact layers or wires 37 are formed on the poly-Si portions 31, 32 and 33 to provide electrical connections to the poly-Si portions 31-33.

Figure 2A:
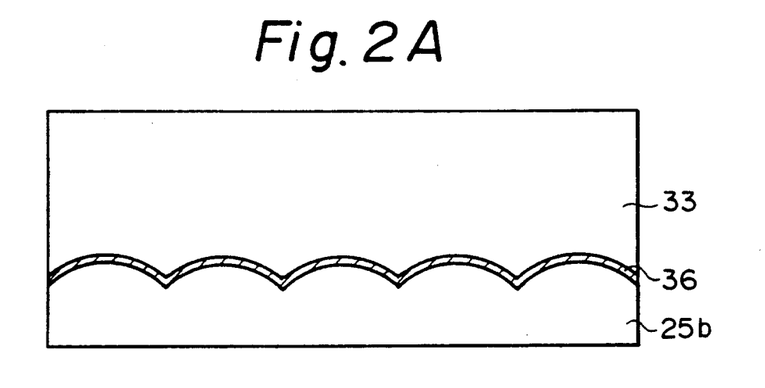
FIGS. 2A to 2C are sectional views showing viscous flow of oxide caused by a heat treatment.
Figure 2B:
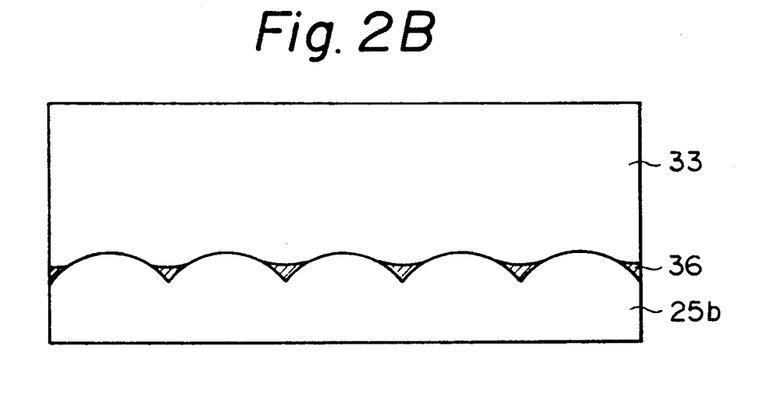
Figure 2C:
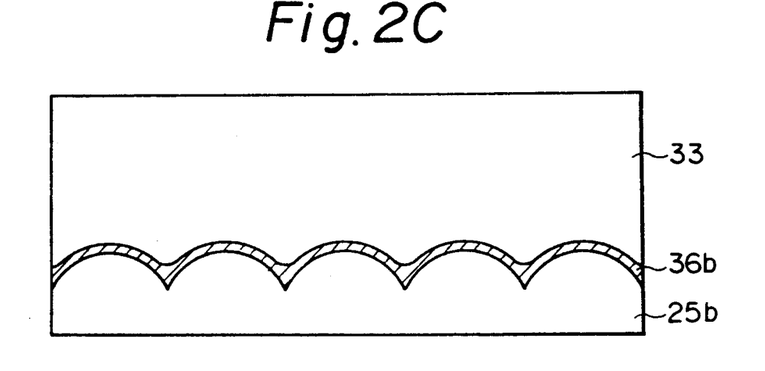

FIGS. 2A to 2C are enlarged sectional views of the WSi layer 25b, the thin oxide layer 36 and the poly-Si portion 33 showing the viscous flow of oxide caused by the heat treatment according to the invention. Before subjection to the heat treatment, the thin oxide layer 36 formed between the WSi layer 25b and the poly-Si portion 33 has a uniform thickness as shown in FIG. 2A. The surface of the WSi layer 25b is undulated, i.e., the grains of WSi cause hills and valleys. When the LPCVD poly-Si layer 33 is deposited on a polycide layer 25 at a temperature of 570° to 650° C., the thin oxide layer 36 having a thickness of 50-100 Å is incidentally formed on the surface of the WSi layer 25b.

When the structure shown in FIG. 2A is subjected to an annealing treatment at a temperature of about 900° to 1150° C., the oxide of the oxide layer 36 located on the hills of the WSi layer 25b moves to the valleys by viscous flow as shown in FIG. 2B, thus causing the layer 33 to directly contact the WSi layer 25b.

However, if the structure shown in FIG. 2A is subjected to the heat treatment at a temperature of below about 900° C., insufficient viscous flow of the oxide of the oxide layer 36 occurs to result in the effective destruction of the oxide layer 36. That is, while a part of the oxide of the thin oxide layer 36 moves to the valleys, the insufficient viscous flow results in a transformed oxide layer 36b which, while being relatively thick in the valleys, still remains as a relatively thin layer on the hills of the WSi layer 25b as shown in FIG. 2C.

Figure 3:
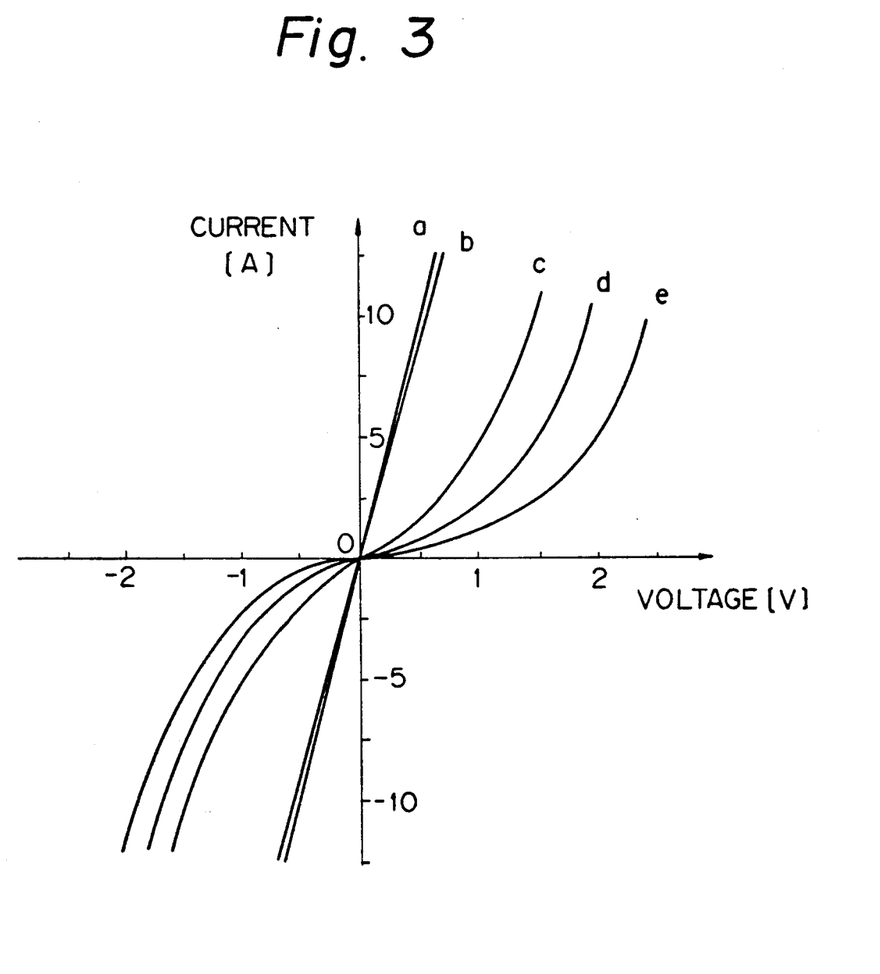
FIG. 3 is a graph showing the current-voltage characteristics of a contact resistance between a silicide layer and a poly-Si layer; and, FIGS. 4a–4c are sectional views showing various steps in a method of manufacturing a wiring structure of a semiconductor device according to a second embodiment of the invention.

FIG. 3 shows the current-voltage characteristics (hereafter I-V characteristics) of the contact resistance between a WSi layer and a poly-Si layer without a heat treatment and with heat treatments at various temperatures for ten seconds. The I-V characteristics of the contact resistance with heat treatments at temperatures of 950° C. (line a) and 900° C. (line b) show that the contact is ohmic. However, the I-V characteristics of the contact resistance without a heat treatment (line e) and with heat treatments at temperatures of 875° C. (line c) and 850° C. (line d) show that the contact is not ohmic and that the resistance without a heat treatment or with a low temperature heat treatment is higher than that with a high temperature heat treatment, i.e. above about 900° C. This result is considered to show that an oxide layer still exists between the WSi layer and the poly-Si layer with heat treatments below about 900° C. If the heat treatment is conducted at a temperature of over 1150° C., the WSi layer is broken or comes off. Therefore, the heat treatment according to the invention is effective at a temperature of between about 900° and 1150° C.

The heat treatment according to the invention can be applied to a contact of a silicide layer and an unburied poly-Si layer. A second embodiment of the invention, which shows the contact of the silicide layer and the unburied poly-Si layer, will be described with reference to FIGS. 4A to 4C.

Figure 4A:
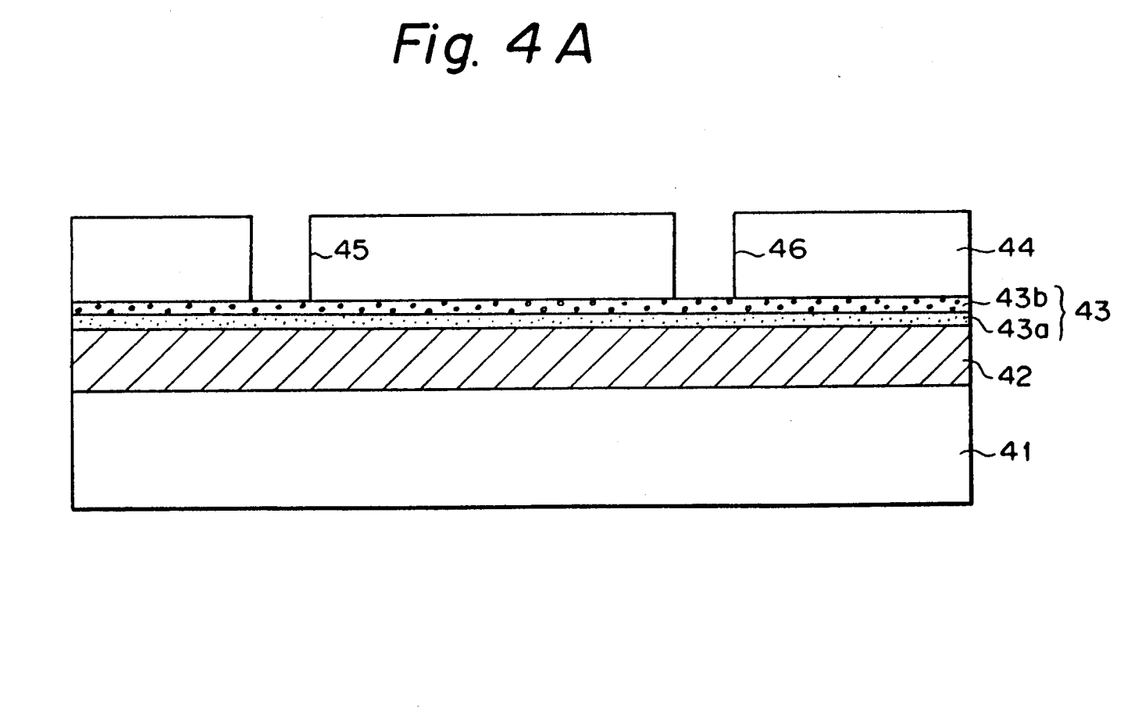

As shown in FIG. 4A, an isolation oxide layer 42 is formed on a silicon substrate 41. A polycide layer 43, which includes a doped poly-Si layer 43a as a lower layer and a first WSi layer 43b as an upper layer, is formed on the isolation oxide layer 42. An insulating layer 44 is formed on the polycide layer 43. Then, portions of the insulating layer 44 are selectively removed photolithographically to form contact holes 45 and 46, all as shown in FIG. 4A. A part of the surface of the polycide layer 43 is exposed by the contact holes 45 and 46.

Figure 4B:
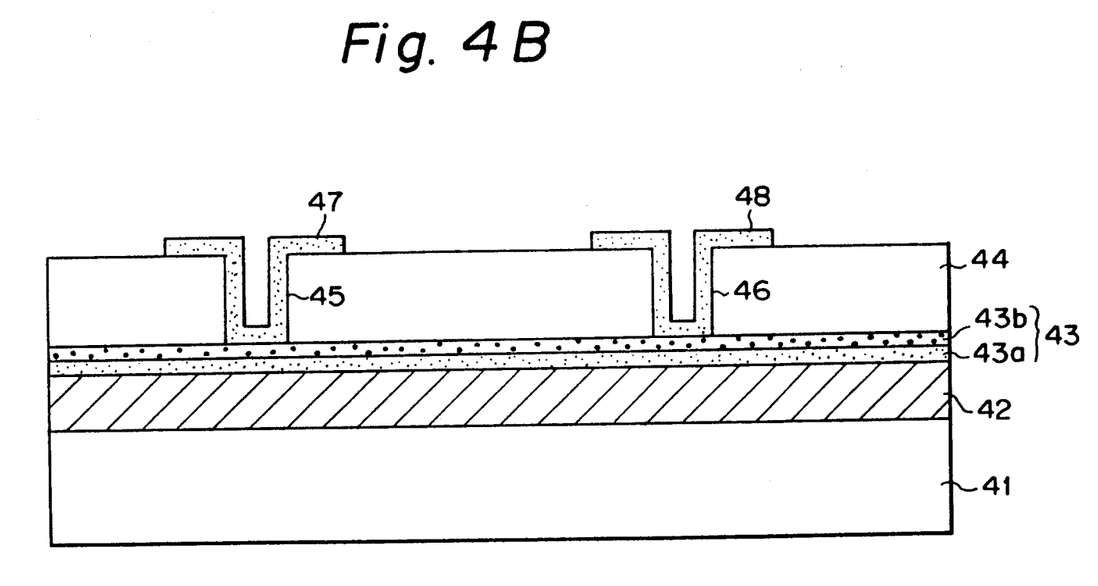

A layer (not shown) of non-doped poly-Si (non-doped poly-Si layer) having a thickness of less than half of the diameter of the contact hole 45 (or 46) is formed by LPCVD on the entire surface of the structure shown in FIG. 4A, and a part of this non-doped poly-Si layer is removed photolithographically to form patterned poly-Si layer portions 47 and 48 as shown in FIG. 4B. Because of the indicated thickness of the non-doped poly-Si layer, the contact holes 45 and 46 are not filled with the non-doped poly-Si. When the non-doped poly-Si layer is formed, incidentally, and as discussed above with respect to the embodiments of FIGS. 1A–1F in oxide layer (not shown but corresponding to the layer 36 above) is formed between the first WSi layer portions 47 and 48 43b and the non-doped poly-Si layer.

Figure 4C:
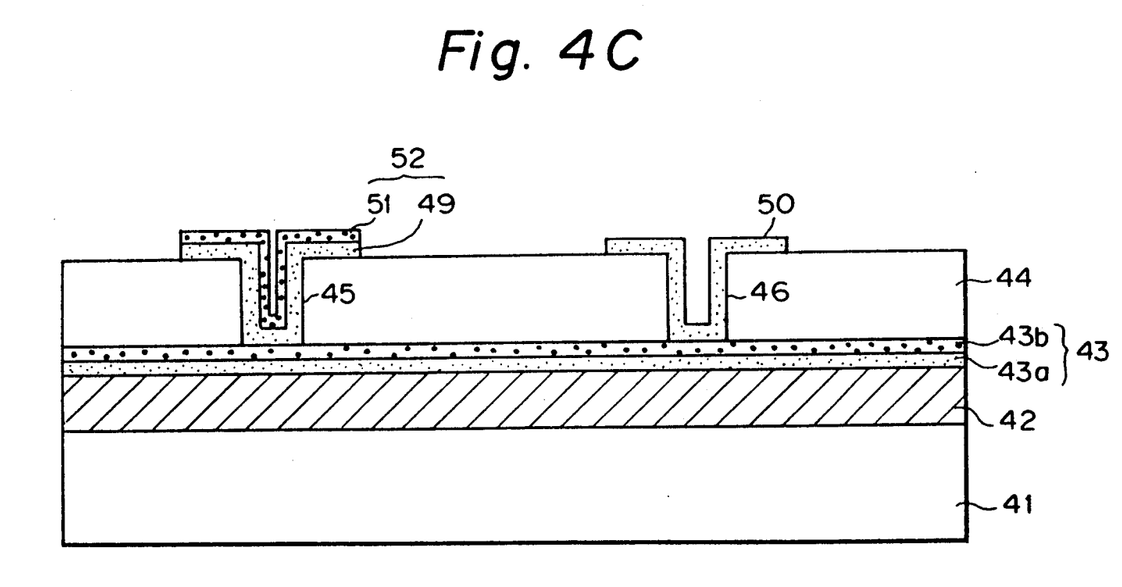

An impurity is introduced into the patterned poly-Si layer portions 47 and 48 by ion implantation to form poly-Si electrodes 49 and 50, respectively. Tungsten (W) is deposited selectively on the poly-Si electrode 49, and a heat treatment is conducted at a temperature of about 850° C. to react the tungsten with the poly-Si in order to form a second WSi layer 51. The second WSi layer 51 and the remaining poly-Si electrode 49 form a polycide electrode 52 as shown in FIG. 4C. Then, in order to activate the introduced impurity, the entire structure shown in FIG. 4C is subjected to a further heat treatment. This heat treatment again is conducted at a temperature of about 900–1150° C. for ten seconds. The heat treatment not only activates the introduced impurity, but simultaneously causes viscous flow of the oxide of the thin oxide layer formed on the first WSi layer 43b to occur, resulting in the destruction of the thin oxide layer and direct contact between the first WSi layer 43b and each of the poly-Si electrode 50 and the polycide electrode 52.

As has been described, according to the invention the oxide layer, which is formed on the polycide layer when poly-Si is formed on the polycide layer, is destroyed by the heat treatment at a temperature of 900 to 1150° C. Therefore, the polycide layer and poly-Si are in direct contact, and the low contact resistance between the polycide layer and poly-Si can be obtained.

It will be understood that the above description of the present invention is susceptible to various modifications, changes and adaptations, and the same are intended to be comprehended within the meaning and range of equivalents of the appended claims.

What is claimed is:

1. A method of manufacturing a contact structure for a semiconductor device comprising the steps of:
   providing a semiconductor substrate;
   forming a silicide layer on a surface of the semiconductor substrate;
   forming a thin oxide layer on the silicide layer incidentally;
   forming a polycrystalline silicon layer on the thin oxide layer;
   introducing an impurity into the polycrystalline silicon layer; and
   subjecting the structure obtained by the above steps to a rapid annealing heat treatment at a temperature above about 900° C. to cause the thin oxide layer to flow viscously into valley portions of grain boundaries of the silicide layer so that the silicide layer forms an ohmic contact with the polycrystalline silicon layer.

2. A method of manufacturing a contact structure according to claim 1, wherein said temperature is between about 900° and 1150° C.

3. A method of manufacturing a contact structure according to claim 2, wherein said silicide layer is WSi.

4. A method of manufacturing a contact structure according to claim 1 wherein said step of introducing an impurity includes implanting the impurity by ion implantation.

5. A method of manufacturing a contact structure according to claim 1, wherein said heat temperature is carried out for about 10 sec at said temperature.

6. A method of manufacturing a contact structure according to claim 1 wherein said step of forming a thin oxide layer incidentally comprises forming an oxide layer with a thickness between about 50 and 100 Å.

7. A method of manufacturing a contact structure for a semiconductor device comprising the steps of:
   providing a semiconductor substrate having an isolation oxide layer on its surface;
   forming a silicide layer on at least a portion of the surface of the isolation oxide layer;
   forming a thin oxide layer of a thickness of about 50–100 Å on the silicide layer incidentally;
   forming an insulating layer on the thin oxide layer, with the insulating layer having a contact hole which exposes a part of the oxide layer;
   depositing polycrystalline silicon onto the exposed oxide layer within the contact hole; and
   producing an ohmic contact between the silicide layer and the polycrystalline silicon layer by subjecting the structure obtained by the above steps to a rapid annealing heat treatment at a temperature above about 900° C. to cause the thin oxide layer to flow viscously into valley portions of grain boundaries of the silicide layer.

8. A method of manufacturing a contact structure according to claim 7, further comprising the step of introducing an impurity into the polycrystalline silicon within the contact hole by ion implantation before the heat treatment.

9. A method of manufacturing a contact structure according to claim 8, wherein said step of subjecting the structure to the heat treatment includes the step of activating the impurity introduced into the polycrystalline silicon 10. A method of manufacturing a contact structure according to claim 7, further comprising the step of forming a doped polycrystalline silicon layer on at least a portion of the surface of the isolation oxide layer before said step of forming a silicide layer, and wherein the silicide layer is formed on the doped polycrystalline silicon layer.

11. A method of manufacturing a contact structure according to claim 10, wherein the silicide layer is a tungsten silicide layer and the temperature is between about 900° C. and 1150° C.

12. A method of manufacturing a contact structure according to claim 7 wherein said heat treatment takes place for approximately 10 sec at said temperature.

13. A method of manufacturing a contact structure according to claim 8 wherein: said substrate has spaced p-type and n-type regions in its said surface and said isolation oxide layer has openings over said p-type and n-type regions; said step of forming an insulating layer includes covering the entire surface of said substrate while leaving additional contact holes over said p-type and said n-type regions, respectively; said step of depositing polycrystalline silicon includes filling each of said contact holes with polycrystalline silicon; and said step of introducing an impurity includes selectivity introducing suitable conductivity type impurities into the polycrystalline silicon in each contact hole by ion implantation.

14. A method of manufacturing a contact structure for a semiconductor device comprising the steps of:
   providing a semiconductor substrate having an isolation oxide layer on its surface;
   forming a silicide layer on at least a portion of the surface of the isolation oxide layer;
   forming an insulating layer on the silicide layer, with the insulating layer having a contact hole which exposes a part of the silicide layer;
   depositing polycrystalline silicon onto the exposed silicide layer within the contact hole, which incidentally forming a thin oxide layer of a thickness of 50–100 Å on the surface of the exposed silicide layer; and
   subjecting the structure obtained by the above steps to a rapid annealing heat treatment at a temperature above about 900° C. for about 10 seconds to cause viscous flow of the oxide of the thin oxide layer and the silicide layer to directly and ohmically contact the deposited polycrystalline silicon.

15. A method of manufacturing a contact structure according to claim 14, further comprising the step of introducing a conductivity type impurity into the polycrystalline silicon layer by ion implantation before the heat treatment.

16. A method of manufacturing a contact structure according to claim 14, further comprising: the step of forming a doped polycrystalline silicon layer on at least a portion of the surface of the isolation oxide layer before said step of forming a silicide layer; and forming the silicide layer on the doped polycrystalline silicon layer.

17. A method of manufacturing a contact structure according to claim 14, wherein the silicide layer is a tungsten silicide layer, and said temperature is between about 900° and 1150° C.

* * * * *